US012782464B2

(12) United States Patent
Ye et al.

(10) Patent No.: US 12,782,464 B2
(45) Date of Patent: Nov. 3, 2026

(54) ELECTRIC LEAKAGE DETECTION METHOD AND ELECTRIC LEAKAGE DETECTION APPARATUS

(71) Applicant: CONTEMPORARY AMPEREX TECHNOLOGY (HONG KONG) LIMITED, Hong Kong (CN)

(72) Inventors: Jinbiao Ye, Ningde (CN); Fenggui Zeng, Ningde (CN); Ying Wu, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 205 days.

(21) Appl. No.: 18/639,792

(22) Filed: Apr. 18, 2024

(65) Prior Publication Data

US 2024/0264244 A1 Aug. 8, 2024

Related U.S. Application Data

(63) Continuation of application No. PCT/CN2023/078393, filed on Feb. 27, 2023.

(30) Foreign Application Priority Data

Feb. 28, 2022 (CN) ......................... 202210187869.6

(51) Int. Cl.
*G01R 31/52* (2020.01)
*G01R 31/367* (2019.01)
*G01R 31/3835* (2019.01)

(52) U.S. Cl.
CPC ......... *G01R 31/52* (2020.01); *G01R 31/3835* (2019.01); *G01R 31/367* (2019.01)

(58) Field of Classification Search
CPC .. G01R 31/52; G01R 31/3835; G01R 31/367; G01R 31/56
See application file for complete search history.

(56) References Cited

U.S. PATENT DOCUMENTS 4,473,795 A * 9/1984 Wood ................. G01R 31/2656 324/501
4,914,395 A * 4/1990 Hamada .................. G01M 3/40 324/557

(Continued)

FOREIGN PATENT DOCUMENTS

CN 102203627 A 9/2011
CN 102621456 A 8/2012

(Continued)

OTHER PUBLICATIONS

The European Patent Office (EPO) The Extended European Search Report for Application No. 23759317.3 Feb. 17, 2025 10 Pages.

(Continued)

*Primary Examiner* — Feba Pothen
(74) *Attorney, Agent, or Firm* — ANOVA LAW GROUP, PLLC

(57) ABSTRACT

An electric leakage detection method is used for detecting an electric leakage region of a component to be tested, which includes a first surface and a second surface, the first surface being provided over at least part of the second surface, and the electric leakage detection method includes: arranging a first conductive element on a side of the first surface away from the second surface, and applying a voltage between the first conductive element and the second surface; and moving the first conductive element relative to the first surface, and determining, under a condition that a resistance between the first conductive element and the second surface is less than (Continued)

a preset resistance, a projection region of the first conductive element on the first surface as the electric leakage region.

12 Claims, 12 Drawing Sheets

(56) References Cited

U.S. PATENT DOCUMENTS

| | | | | |
|---|---|---|---|---|
| 5,146,509 | A * | 9/1992 | Hara | G06T 7/001 348/126 |
| 9,891,263 | B2 | 2/2018 | Hanawa | |
| 2012/0123699 | A1 * | 5/2012 | Kawata | G01N 27/9006 702/35 |
| 2016/0282403 | A1 | 9/2016 | Hanawa | |

FOREIGN PATENT DOCUMENTS

| | | | |
|---|---|---|---|
| CN | 209542765 | U | 10/2019 |
| CN | 111357145 | | 6/2020 |
| CN | 211653103 | U | 10/2020 |
| CN | 212749119 | U | 3/2021 |
| CN | 213122174 | U | 5/2021 |
| CN | 113030108 | A | 6/2021 |
| CN | 214010397 | U | 8/2021 |
| CN | 113538376 | A | 10/2021 |
| CN | 214375095 | U | 10/2021 |
| DE | 224174 | A3 | 6/1985 |
| JP | H10123100 | A | 5/1998 |
| JP | 2002296243 | A | 10/2002 |
| JP | 2004347523 | A | 12/2004 |
| JP | 4219489 | B2 * | 2/2009 |
| JP | 2021148548 | A | 9/2021 |

OTHER PUBLICATIONS

China National Intellectual Property Administration (CNIPA) The First Office Action for Application No. 202210187869.6, Jun. 6, 2026 17 Pages (including translation).

The World Intellectual Property Organization (WIPO) International Search Report for PCT/CN2023/078393 Jun. 1, 2023 8 Pages (including translation).

* cited by examiner

ELECTRIC LEAKAGE DETECTION METHOD AND ELECTRIC LEAKAGE DETECTION APPARATUS

CROSS-REFERENCE TO RELATED APPLICATIONS

The present application is a continuation of International Application No. PCT/CN2023/078393, filed on Feb. 27, 2023, which claims priority to Chinese Patent Application No. 202210187869.6 filed on Feb. 28, 2022, and titled "ELECTRIC LEAKAGE DETECTION METHOD AND ELECTRIC LEAKAGE DETECTION APPARATUS," the entire contents of both of which are incorporated herein by reference.

TECHNICAL FIELD

The present application relates to the technical field of batteries, and more particularly, to an electric leakage detection method and an electric leakage detection apparatus.

BACKGROUND

In order to protect a device, a protective coating is usually provided on an external surface of the device. For example, an insulation layer is formed by spraying to prevent electric leakage of the device. A defect may occur during the formation of the insulation layer, and may cause the coating to fail to provide good protection, resulting in electric leakage in a region of the defect. In order to repair the electric leakage region, the position of the electric leakage region needs to be detected in advance.

Accordingly, there is an urgent need for a method that can improve the accuracy of detecting the position of the electric leakage region.

SUMMARY

The present application provides an electric leakage detection method and an electric leakage detection apparatus, aiming at improving the accuracy of detecting a position of an electric leakage region.

In a first aspect, embodiments of the present application provides an electric leakage detection method for detecting an electric leakage region of a component to be tested, the component to be tested includes a first surface and a second surface, the first surface is provided over at least part of the second surface, and the electric leakage detection method includes: arranging a first conductive element on a side of the first surface away from the second surface, and applying a voltage between the first conductive element and the second surface; and moving the first conductive element relative to the first surface, and determining, under a condition that a resistance between the first conductive element and the second surface is less than a preset resistance, a projection region of the first conductive element on the first surface as the electric leakage region.

Therefore, in the electric leakage detection method according to the above technical solution, the first conductive element moves relative to the first surface, and under a condition that the first conductive element is located in the electric leakage region, a detected resistance is less than the preset resistance, the position electric of the leakage region is thus determined, and accuracy of electric leakage detection can be significantly improved.

In some embodiments, moving the first conductive element relative to the first surface, and determining, under a condition that the resistance between the first conductive element and the second surface is less than the preset resistance, the projection region of the first conductive element on the first surface as the electric leakage region includes: moving the first conductive element relative to the first surface along a first direction, and determining, under a condition that the resistance between the first conductive element and the second surface is less than the preset resistance, a distance the first conductive element moves along the first direction as a first coordinate value; moving the first conductive element relative to the first surface along a second direction, and determining, under a condition that the resistance between the first conductive element and the second surface is less than the preset resistance, a distance the first conductive element moves along the second direction as a second coordinate value, wherein the first direction intersects the second direction; and obtaining the electric leakage region based on a coordinate set obtained by permutation and combination of the first coordinate value and the second coordinate value.

Therefore, in the above technical solution, the coordinate set corresponding to the detected resistance less than the preset resistance is determined by moving the first conductive element along the first direction and the second direction each, so as to determine the position of the electric leakage region more accurately.

In some embodiments, obtaining the electric leakage region based on the coordinate set obtained by permutation and combination of the first coordinate value and the second coordinate value includes: determining whether the number of positions in the first surface corresponding to the coordinate set is one, and determining, under a condition that the number of the positions is one, the position in the first surface corresponding to the coordinate set as the electric leakage region; and detecting, under a condition that the number of the positions is plural, electric leakage information of the positions each to determine the electric leakage region.

In the embodiments of the present application, interference points in the coordinate set may be excluded by detecting the number of the positions contained in the coordinate set, thereby further improving the accuracy of detecting the electric leakage region.

In some embodiments, the step of detecting electric leakage information of the positions each to determine the electric leakage region includes: arranging a second conductive element in each of the positions, and applying a voltage between the second conductive element and the second surface; and determining, under a condition that a resistance between the second conductive element and the second surface is less than a preset resistance, a projection region of the second conductive element on the first surface as the electric leakage region.

In the embodiments of the present application, the second conductive element is arranged in each of the positions for performing independent detection. Under a condition that the detected resistance is greater than or equal to the preset resistance, the position may be determined as an interference point, and the interference point is excluded; under a condition that the detected resistance is less than the preset resistance, the position may be determined as the electric leakage region.

In some embodiments, the step of detecting electric leakage information of the positions each to determine the electric leakage region includes: acquiring picture information of each of the positions; and determining, under a condition that the picture information contains defect information, a position corresponding to the defect information as the electric leakage region.

In the embodiments of the present application, the acquired picture information is analyzed to determine whether the picture information contains the defect information. Under a condition that the picture information contains the defect information, the position is the electric leakage region; and under a condition that the picture information does not contain the defect information, the position may be excluded.

In some embodiments, the electric leakage detection method further includes: covering all the first surface with a third conductive element; and applying a voltage between the third conductive element and the second surface, and performing, under a condition that a resistance between the third conductive element and the second surface is less than a preset resistance, the step of arranging the first conductive element on the side of the first surface away from the second surface, and applying the voltage between the first conductive element and the second surface.

In the embodiments of the present application, it is determined in advance whether the first surface contains the electric leakage region by using the third conductive element, thereby improving efficiency of electric leakage detection.

In a second aspect, the embodiments of the present application provide an electric leakage detection apparatus configured to detect an electric leakage region of a component to be tested, the component to be tested includes a first surface and a second surface, the first surface is provided over at least part of the second surface, and the electric leakage detection apparatus includes a base, a voltage supply device, a detection device and a power source. The base is configured to hold the component to be tested; the voltage supply device is arranged on the base, and one terminal of the voltage supply device is electrically connected to the second surface; the detection device is electrically connected to the other terminal of the voltage supply device, and the detection device is arranged on a side of the first surface away from the second surface; and the power source is connected to the component to be tested and/or the detection device to drive the component to be tested and the detection device to move relatively, so as to determine the electric leakage region under a condition that a resistance between the detection device and the second surface is less than a preset resistance.

Therefore, in the electric leakage detection apparatus of the above technical solution, the power source can move the detection device relative to the first surface, and under a condition that the detection device is located in the electric leakage region, the detected resistance is less than the preset resistance, the position of the electric leakage region is thus determined, and the accuracy of electric leakage detection can be significantly improved.

In some embodiments, the detection device includes a first conductive element. The first conductive element is electrically connected to the voltage supply device and arranged on the side of the first surface away from the second surface, and the power source is configured to drive the component to be tested and/or the first conductive element to move relatively along a first direction and a second direction each, so as to obtain, under a condition that a resistance between the first conductive element and the second surface is less than a preset resistance, a coordinate set and the electric leakage region, wherein the first direction intersects the second direction.

In the embodiments of the present application, the coordinate set corresponding to the detected resistance less than the preset resistance can be determined based on moving the first conductive element relative to the first surface along the first direction and the second direction each, so as to obtain the electric leakage region, thereby further improving the accuracy of electric leakage detection.

In some embodiments, an outline shape of the first conductive element matches a shape of the first surface. In the embodiments of the present application, the outline shape of the first conductive element facilitates the first conductive element moving relative to the first surface.

In some embodiments, the detection device further includes a second conductive element. The second conductive element is electrically connected to the voltage supply device, and the second conductive element is arranged on the first surface at a position corresponding to the coordinate set and is configured to determine, under a condition that a resistance between the second conductive element and the second surface is less than a preset resistance, a projection region of the second conductive element on the first surface as the electric leakage region.

In the embodiments of the present application, detection is performed on the position in the first surface corresponding to the coordinate set by arranging the second conductive element, and thus a non-electric-leakage region may be excluded, thereby further improving the accuracy of electric leakage detection.

In some embodiments, the detection device includes a support mechanism connected to the first conductive element. The power source includes a first drive mechanism and a second drive mechanism. The first drive mechanism is connected to the support mechanism and configured to drive the support mechanism to move the first conductive element, so that the first conductive element is moved relative to the first surface; the second drive mechanism includes a drive component connected to the support mechanism and a drive shaft connected to the drive component, and the drive shaft penetrates through the support mechanism and is connected to the second conductive element, so as to drive the second conductive element to move toward or away from the first surface.

In the embodiments of the present application, the first drive mechanism drives the first conductive element to move, and the second drive mechanism drives the second conductive element to move, so that distances the first conductive element and the second conductive element move can be controlled precisely, thereby improving the accuracy of detection. In addition, in the embodiments of the present application, the detection device and the drive source may be integrated into an integrated structure to facilitate assembly.

In some embodiments, the detecting apparatus further includes a picture acquisition element configured to acquire picture information containing positions in the first surface corresponding to the coordinate set, and determine, under a condition that the picture information contains defect information, a position corresponding to the defect information as the electric leakage region.

In the embodiments of the present application, picture information analysis is performed on the position in the first surface corresponding to the coordinate set by the picture acquisition element, and thus a non-electric-leakage region may be excluded, thereby further improving the accuracy of electric leakage detection.

In some embodiments, the detection device further includes a third conductive element electrically connected to the voltage supply device, and the third conductive element covers all the first surface and is configured to determine, under a condition that a resistance between the third conductive element and the second surface is less than a preset resistance, an electric leakage condition of the first surface.

In the embodiments of the present application, the predetermination of electrical leakage of the first surface may be performed on the component to be tested in advance by providing the third conductive element, thereby improving the efficiency of electric leakage detection.

BRIEF DESCRIPTION OF THE DRAWINGS

Features, advantages, and technical effects of exemplary embodiments of the present application will be described below with reference to the accompanying drawings.

Figure 1:
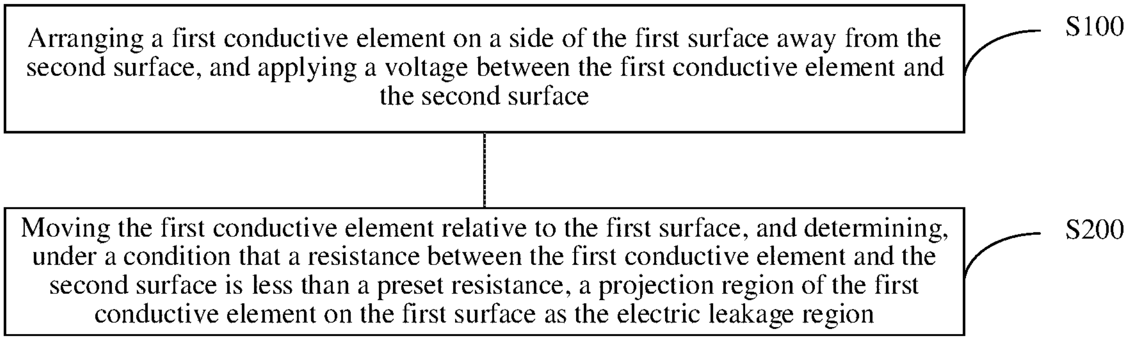
FIG. 1 is a schematic flowchart of an electric leakage detection method according to some embodiments of the present application.

The drawings are not necessarily drawn to actual scale.

REFERENCE SIGNS

X: First direction; Y: Second direction;
1: Electric leakage detection apparatus;
10: Base; 11: First portion; 12: Second portion;
20: Voltage supply device;
30: Detection device; 31: First conductive element; 32: Second conductive element; 33: Support mechanism;
40: Power source; 41: First drive mechanism; 42: Second drive mechanism; 43: Third conductive element;
50: Component to be tested; B: Battery cell; b1: First surface; b2: Second surface; L: Electric leakage region; 2: Casing body; 3: End cap; 4: Insulation layer; 5: Electrode assembly.

DETAILED DESCRIPTION

In order to make the purposes, technical solutions and advantages of embodiments of the present application more clear, the technical solutions of the embodiments of the present application will be described clearly in conjunction with the drawings in the embodiments of the present application. Obviously, the described embodiments are a part of the embodiments of the present application, but not all of the embodiments. Based on the embodiments in the present application, all other embodiments obtained by those ordinary skilled in the art without any creative work shall fall within the protection scope of the present application.

Unless otherwise defined, all technical and scientific terms used in the present application have the same meanings as commonly understood by those skilled in the technical field of the present application. In the present application, the terms used in the description of the present application are only for purposes of description of specific embodiments, and are not intended to limit the present application. The terms “comprising” and “having” in the description and claims of the present application and the above brief description of the drawings and any variations thereof are intended to cover non-exclusive inclusions. The terms “first”, “second” and the like in the description and claims or the above brief description of the drawings of the present application are used to distinguish different objects, rather than to describe a specific order or primary and secondary relationship.

Reference to “an embodiment” in the present application means that a particular feature, structure or characteristic described in connection with the embodiment may be included in at least one embodiment of the present application. Appearances of the phrase in various positions in the description are not necessarily all referring to the same embodiment, nor a separate or alternative embodiment that is mutually exclusive of other embodiments.

In the description of the present application, it should be noted that, unless otherwise expressly specified and limited, the terms “installed”, “connected”, “connection” and “attached” should be understood in a broad sense, for example, they may refer to a fixed connection, a detachable connection or an integral connection, which may be a direct connection, an indirect connection via an intermediate medium, or an internal communication between two elements. For those of ordinary skill in the art, the specific meanings of the above-mentioned terms in the present application can be understood in accordance with specific conditions.

The term "and/or" in the present application is only a kind of association relationship that describes associated objects, which indicates three possible kinds of relationships. For example, A and/or B may indicate the following three cases: A exists alone, A and B exist simultaneously, and B exists alone. In addition, the character "/" in the present application generally indicates that the associated objects have an "or" relationship.

In the embodiments of the present application, the same reference numerals denote the same components, and for brevity, in different embodiments, detailed descriptions of the same components are omitted. It should be understood that sizes, such as a thickness, a length and a width, and the like of various components in the embodiments of the present application shown in the drawings, as well as an overall thickness, a length and a width, and the like of an integrated device are only exemplary descriptions, and should not constitute any limitation to the present application.

The "plural" that appears in the present application refers to two or more (including two).

In the present application, a battery cell may include a lithium ion secondary battery, a lithium ion primary battery, a lithium sulfur battery, a sodium lithium ion battery, a sodium ion battery, a magnesium ion battery, or the like, which is not limited in the embodiments of the present application. The battery cell may be in the shape of a cylinder, a flat body, a cuboid, or other shapes, which is not limited in the embodiments of the present application. Battery cells are generally categorized into three types depending on their packaging manners, including cylindrical battery cells, rectangular battery cells, and soft pack battery cells, which are not limited in the embodiments of the present application.

The battery cell may further include a housing assembly having an accommodating cavity inside, and the accommodating cavity is a closed space provided by the housing assembly for an electrode assembly and an electrolyte. The housing assembly includes a casing body and an end cap component. The casing body is a hollow structure with an opening on one side. The end cap component covers the opening of the casing body and forms a sealing connection to form an accommodating cavity for accommodating the electrode assembly and the electrolyte.

During the production of a battery cell, an insulation layer needs to be provided outside the casing body of the battery cell to prevent electric leakage caused by contact of the casing body with an external conductive element. The insulation layer may be formed by spraying an insulating material on the surface of the casing body and then curing. A defect point may be formed during the process of providing the insulation layer outside the casing body, and the defect point cannot cover the casing body, so that electric leakage may occur at this position in the casing body, thereby causing a safety risk on the battery cell. Accordingly, electric leakage detection needs to be performed on the battery cell.

Not only the field of batteries involves the electric leakage detection, but also devices in other fields involve the electric leakage detection. For example, the electric leakage detection is performed on a motor device.

The inventors have found that, at present, under a condition that the electric leakage detection is performed on a device, conductive foam is in contact with all surfaces of the device to detect a surface where the defect point is located, but the specific position of the defect point cannot be detected, thereby making it difficult to accurately repair the defect point, which is not beneficial to smoothly performing subsequent processes.

In view of this, the present application provides an electric leakage detection method for detecting an electric leakage region of a component to be tested. A detection device is provided, and the detection device is moved relative to a surface of the component to be tested, so as to detect the electric leakage region. The method is not only applicable to the field of batteries (such as, defect detection of an insulation layer of a battery cell), but also applicable to other fields (such as, defect detection of a device having a coating).

As shown in FIG. 1, the electric leakage detection method according to the present application is used for detecting an electric leakage region of a component to be tested, the component to be tested includes a first surface and a second surface, the first surface is provided over at least part of the second surface, and the electric leakage detection method includes:

- S100, arranging a first conductive element on a side of the first surface away from the second surface, and applying a voltage between the first conductive element and the second surface;
- S200, moving the first conductive element relative to the first surface, and determining, under a condition that a resistance between the first conductive element and the second surface is less than a preset resistance, a projection region of the first conductive element on the first surface as the electric leakage region.

The first surface of the component to be tested may be an insulation surface, or may be of course a conductive surface. The second surface may be a conductive surface. In an example, the first surface is an insulation surface, the second surface is a conductive surface, the first surface is arranged on a side of the second surface, and the first surface can have a function of insulation and protection. The above example is only an exemplary illustration, and is not used to limit the scope of the embodiments of the present application.

The first surface is formed over the second surface, and a sum of resistances of the first surface and the second surface is greater than a resistance of the second surface. However, during the formation of the first surface on the second surface, a defect position (such as a pinhole, a blank, a scratch, and the like) may occur on the first surface. At the defect position, the sum of the resistances of the first surface and the second surface may decrease, and even decreases until the sum of the resistances of the first surface and the second surface is equal to the resistance of the second surface. According to Ohm's law, under a condition that the voltage is constant, the resistance is inversely proportional to the current, and the greater the resistance is, the less the current is; the less the resistance is, the greater the current is. At the defect position, the current flowing through increases as the resistance decreases. Accordingly, in the present application, the defect position may be considered as the electric leakage region, and the resistance at the defect position may be considered as a criterion for determining whether electric leakage occurs.

As the name implies, the first conductive element is an element which is conductive, and may be connected to a negative electrode of a power supply; accordingly, a positive electrode of the power supply is connected to the second surface. Of course, the negative electrode of the power supply may be connected to the second surface, and under this condition, the positive electrode of the power supply is connected to the first conductive element. The first conductive element is arranged on a side of the first surface away from the second surface. The first conductive element may be in direct contact with the first surface, the first conductive element may not be in contact with the first surface, or there is a certain spacing between the first conductive element and the first surface. Under a condition that the first conductive element is in contact with the first surface, a voltage can be transmitted from the first conductive element to the first surface and/or the second surface. Under a condition that there is a spacing between the first conductive element and the first surface, air occupies the spacing, and a voltage can break down the air and can be transmitted to the first surface and/or the second surface.

The first conductive element may be moved relative to the first surface, and may be arranged in a bar-like structure, a spherical structure, or the like. In the moving approach according to the present application, the first conductive element may be moved, or the first surface may be moved, or, of course, the two may be moved relatively along different directions.

The projection region of the first conductive element on the first surface means that the first conductive element is projected on the first surface along a normal line direction of the first surface, and a projection surface formed by the first conductive element constitutes the projection region of the first conductive element on the first surface. Under a condition that the first conductive element is or is not in contact with the first surface, the specific position of the first conductive element may be determined using the projection region of the first conductive element on the first surface.

When the first conductive element moves relative to the first surface, under a condition that the first conductive element is located in a non-electric-leakage region, the detected resistance between the first conductive element and the second surface is relatively great; under a condition that the first conductive element is located in the electric leakage region, the detected resistance between the first conductive element and the second surface is relatively small. In the present application, the specific position of the electric leakage region may be determined according to the change of the resistance.

It may be understood that, the detected resistance may be compared to the preset resistance in order to directly determine the specific position of the electric leakage region. In an example, under a condition that the detected resistance is greater than or equal to the preset resistance, the position is determined as the non-electric-leakage region, and under a condition that the detected resistance is less than the preset resistance, the position is determined as the electric leakage region. That is, the defect exists in the position, and the position may be repaired according to product requirements.

In the electric leakage detection method according to the embodiments of the present application, the first conductive element is moved relative to the first surface, and under a condition that the first conductive element is located in the electric leakage region, a detected resistance is less than the preset resistance, the position of the electric leakage region is thus determined, and accuracy of electric leakage detection can be significantly improved.

Figure 2:
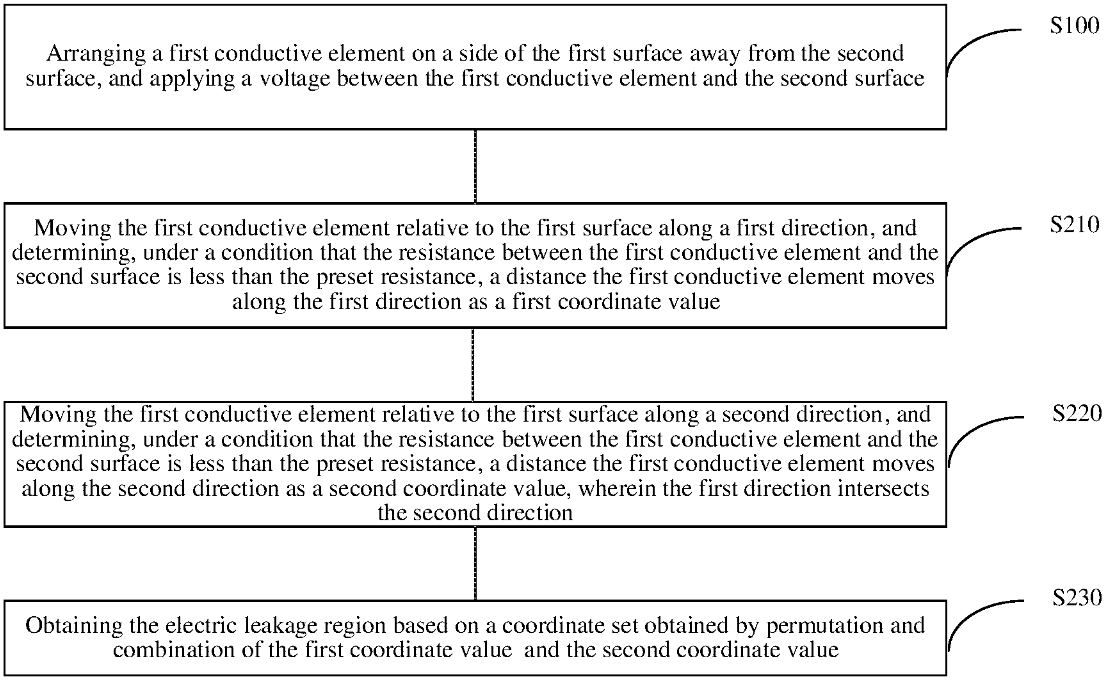
FIG. 2 is a schematic flowchart of an electric leakage detection method according to some other embodiments of the present disclosure.

In some optional implementations, in order to determine the position of the electric leakage region more accurately, the first conductive element may be moved along different directions. Specifically, as shown in FIG. 2, step S200 includes:

S210, moving the first conductive element relative to the first surface along a first direction, and determining, under a condition that the resistance between the first conductive element and the second surface is less than the preset resistance, a distance the first conductive element moves along the first direction as a first coordinate value;

S220, moving the first conductive element relative to the first surface along a second direction, and determining, under a condition that the resistance between the first conductive element and the second surface is less than the preset resistance, a distance the first conductive element moves along the second direction as a second coordinate value, wherein the first direction intersects the second direction; and S230, obtaining the electric leakage region based on a coordinate set obtained by permutation and combination of the first coordinate value and the second coordinate value.

The first direction intersects the second direction, the first conductive element is moved relative to the first surface along the first direction and the second direction each, and a moving path of the first conductive element may completely cover the whole region of the first surface. In an example, the first direction is perpendicular to the second direction, one of the end points of the first surface is used as an origin point, the first direction and the second direction are used as an abscissa direction and an ordinate direction, respectively, and thus a plane rectangular coordinate system may be formed.

The distance the first conductive element moves along the first direction is determined as the first coordinate value, that is, the first coordinate value is an abscissa value relative to the origin point. The distance the first conductive element moves along the second direction is determined as the second coordinate value, that is, the second coordinate value is an ordinate value relative to the origin point. The abscissa value(s) and the ordinate value(s) form a coordinate set, and the electric leakage region may be determined according to the coordinate set.

In the embodiments of the present application, the coordinate set corresponding to the detected resistance less than the preset resistance is determined by moving the first conductive element along the first direction and the second direction, and thus the electric leakage region is determined, thereby further improving the accuracy of detecting the electric leakage region.

Figure 3:
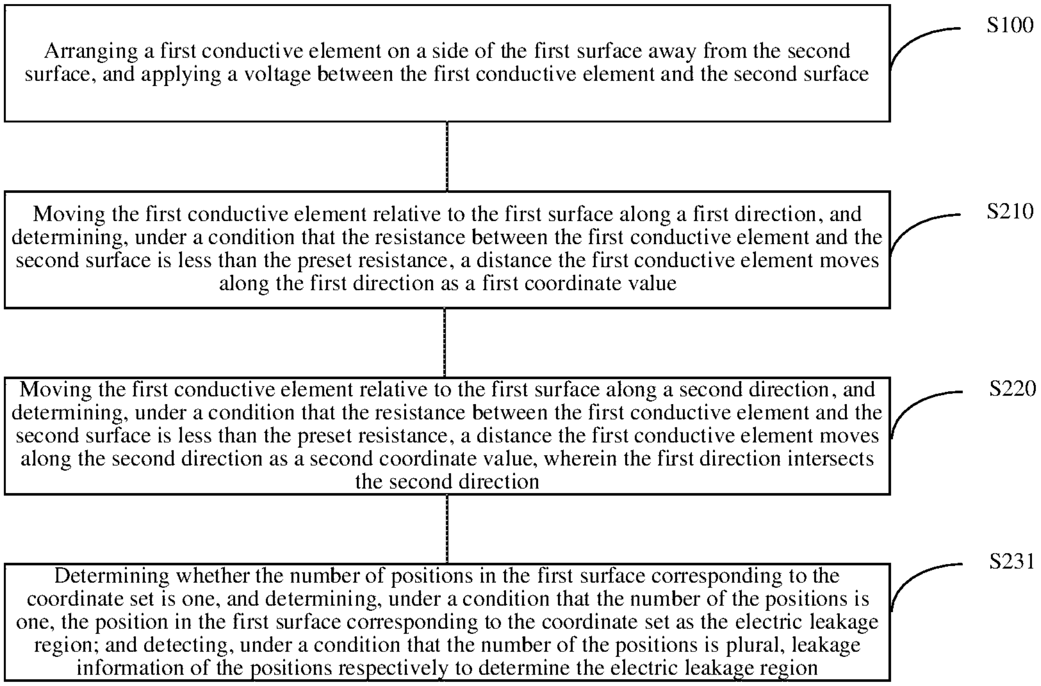
FIG. 3 is a schematic flowchart of an electric leakage detection method according to yet some other embodiments of the present application.

As some examples, as shown in FIG. 3, step S230 includes:

S231, determining whether the number of positions in the first surface corresponding to the coordinate set is one, and determining, under a condition that the number of the positions is one, the position in the first surface corresponding to the coordinate set as the electric leakage region; and detecting, under a condition that the number of the positions is plural, electric leakage information of the positions each to determine the electric leakage region.

Under a condition that there is only one electric leakage region on the first surface, a set of a first coordinate value and a second coordinate value is a fixed coordinate, and the position is a corresponding electric leakage region. Under a condition that there are a plurality of electric leakage regions on the second surface, a set of first coordinate values and second coordinate values include a plurality of coordinates, and it is needed to further determine whether all of the plurality of coordinates are the electric leakage region. By performing electric leakage detection on positions contained in the coordinate set, interference points in the coordinate set may be excluded, thereby further improving the accuracy of detecting the electric leakage region.

It may be understood that, the number of coordinates contained in the coordinate set is related to the number of the electric leakage regions and a size of a cross sectional area of the first conductive element parallel to the first surface.

In an example, relative to an area of the first surface, the cross sectional area of the first conductive element parallel to the first surface is relatively small, and under a condition that the first conductive element is moved relative to the first surface, the electric leakage region on the first surface may be accurately determined according to the position of the first conductive element.

Figure 4:
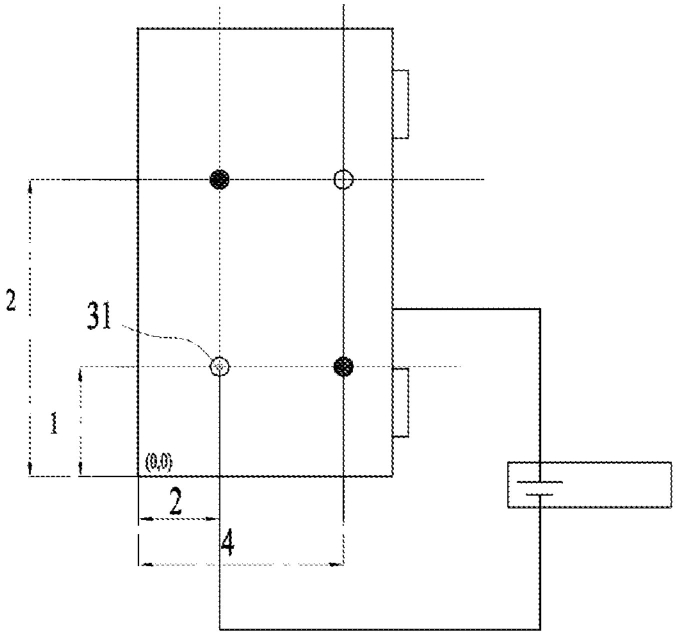
FIG. 4 is a schematic application view an electric leakage detection apparatus according to some embodiments of the present application.

As shown in FIG. 4, specifically, with respect to the origin point (0, 0), actual coordinates of the electric leakage regions are (2, 2) and (4, 1), and under a condition that the first conductive element 31 is located at (2, 2) and (4, 1) each, the resistances of the positions may be detected to be less than the preset resistance. However, since the cross sectional area of the first conductive element 31 parallel to the first surface is relatively small, and when the first conductive element 31 detects other positions, the first conductive element 31 does not cover positions of (2, 2) and (4, 1). That is, (2, 2) and (4, 1) do not interfere with a detection result of the first conductive element 31 for other positions, and the first conductive element 31 detects that the resistance of other positions is greater than or equal to the preset resistance. Therefore, when the cross sectional area of the first conductive element parallel to the first surface is relatively small, the accuracy of detecting the electric leakage region can be further improved.

Alternatively, in an example, the cross sectional area of the first conductive element parallel to the first surface is relatively great. For example, a size of the first conductive element along its own axial direction is greater than a length size of the first surface and is also greater than a width size of the first surface. When the first conductive element is relatively moved along the length size of the first surface, the first conductive element may cover all positions of the first surface; and under a condition that the first conductive element is relatively moved along the width size of the first surface, the first conductive element may cover all positions of the first surface. Under a condition that the coordinate set includes a plurality of coordinates, there may be some of the plurality of coordinates corresponding to the non-electric-leakage region in the first surface.

Figure 5:
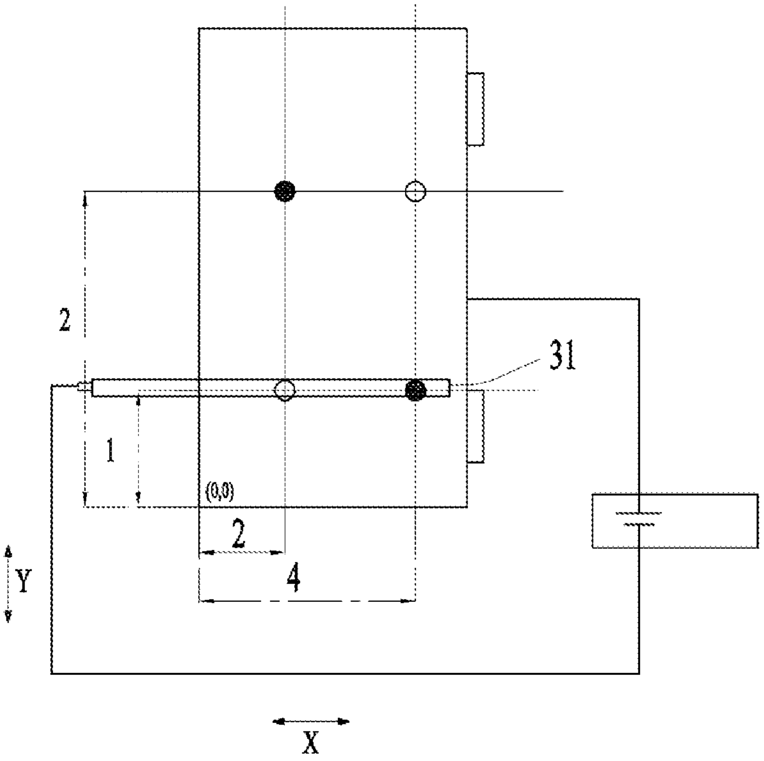
FIG. 5 is a schematic application view of an electric leakage detection apparatus according to some other embodiments of the present application.

As shown in FIG. 5, specifically, compared with the origin point (0, 0), the actual coordinates of the electric leakage region are (2, 2) and (4, 1). Under a condition that the first conductive element 31 is moved along a first direction X to the abscissa 2, the first conductive element 31 covers all positions with the abscissa 2 on the first surface; and under a condition that the first conductive element 31 is moved along the first direction X to the abscissa 4, the first conductive element 31 covers all positions with the abscissa 4 on the first surface. Under a condition that the first conductive element 31 is moved along a second direction Y to the ordinate 2, the first conductive element 31 covers all positions with the ordinate 2 on the first surface, and under a condition that the first conductive element 31 is moved along the second direction Y to the ordinate 1, the first conductive element 31 covers all positions with the ordinate 1 on the first surface. Under this condition, the coordinate set detected by the first conductive element 31 includes (2, 2), (4, 1), (2, 1) and (4, 2), among which (2, 1) and (4, 2) are non-electric-leakage regions, and need to be excluded through further detection.

Performing detection on electric leakage information of the positions includes a plurality of approaches which are described in detail below.

Figure 6:
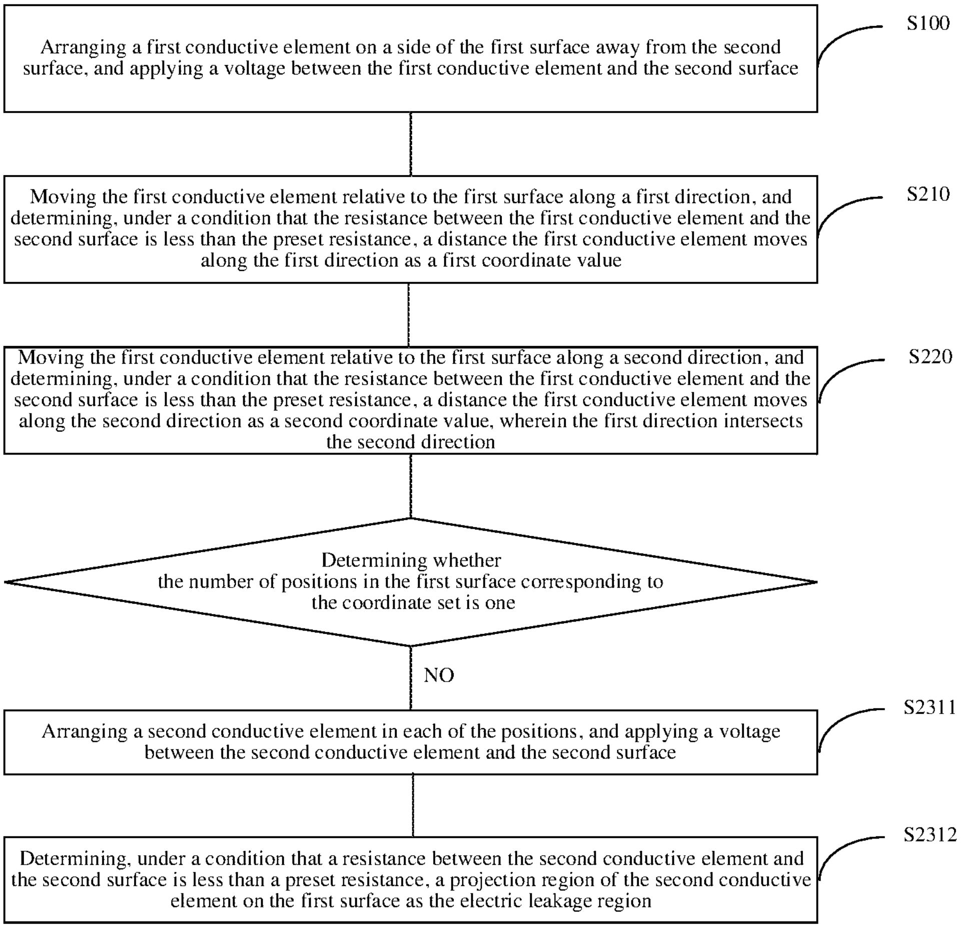
FIG. 6 is a schematic flowchart of an electric leakage detection method according to yet some other embodiments of the present application.

Optionally, as shown in FIG. 6, in step S231, the step of detecting electric leakage information of the positions each to determine the electric leakage region further includes:

S2311, arranging a second conductive element in each of the positions, and applying a voltage between the second conductive element and the second surface.

S2312, determining, under a condition that a resistance between the second conductive element and the second surface is less than a preset resistance, a projection region of the second conductive element on the first surface as the electric leakage region.

The second conductive element may be used as a part of the detection device. In order to accurately detect the electric leakage region and exclude the non-electric-leakage region (that is, exclude the interference points), the second conductive element may be arranged in each of the positions for performing independent detection. Under a condition that the detected resistance is less than the preset resistance, the position may be determined as the leakage region; under a condition that the detected resistance is greater than or equal to the preset resistance, the position may be determined as the interference point, and thus the interference point is excluded.

Figure 7:
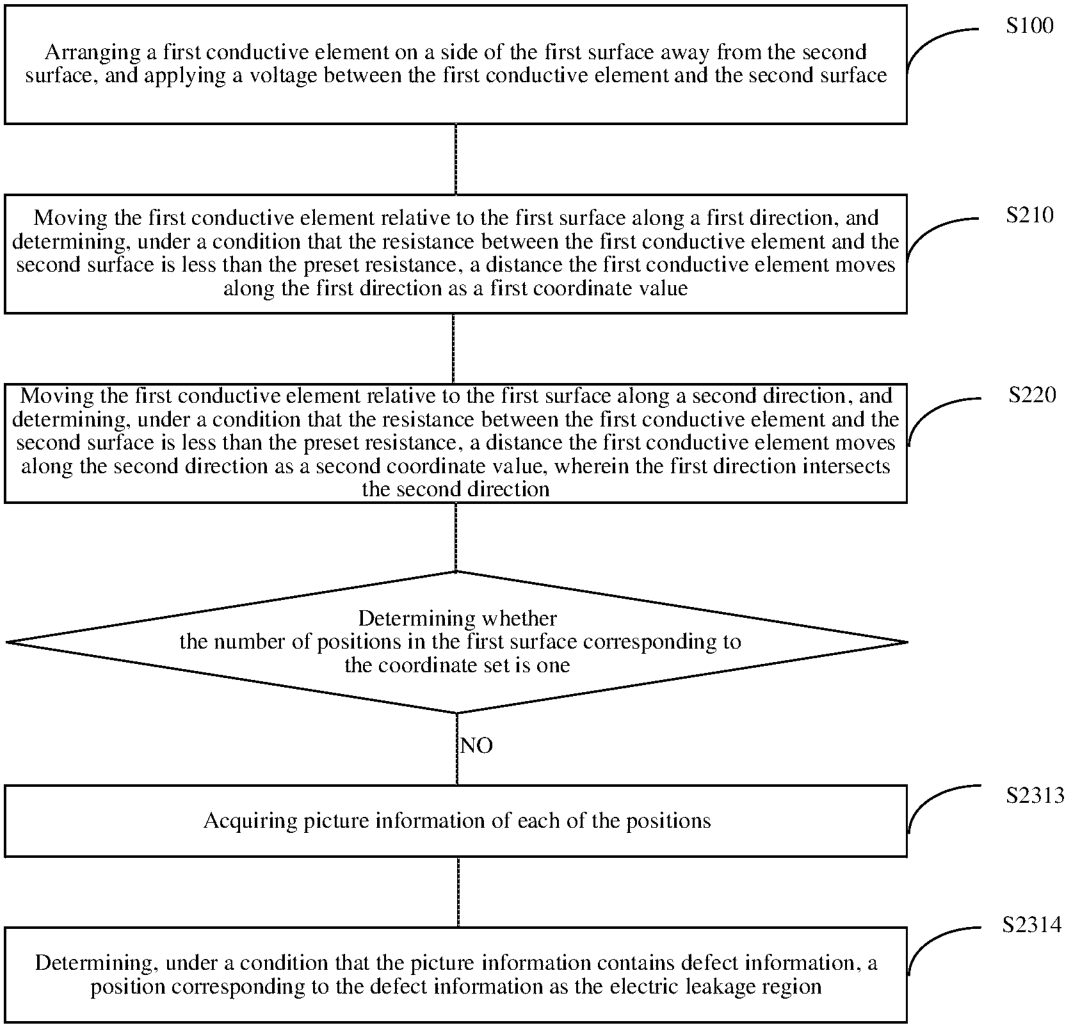
FIG. 7 is a schematic flowchart of an electric leakage detection method according to yet some other embodiments of the present application.

Optionally, as shown in FIG. 7, in step S231, the step of detecting electric leakage information of the positions each to determine the electric leakage region includes:

S2313, acquiring picture information of each of the positions; and

S2314, determining, under a condition that the picture information contains defect information, a position corresponding to the defect information as the electric leakage region.

The picture information of each of the positions may be acquired by photographing, scanning, and the like. The acquired picture information is analyzed to determine whether the picture information contains the defect information (such as a pinhole, blank, a scratch, and the like). Under a condition that the picture information contains the defect information, the position is the electric leakage region; and under a condition that the picture information does not contain the defect information, the position may be excluded.

Figure 8:
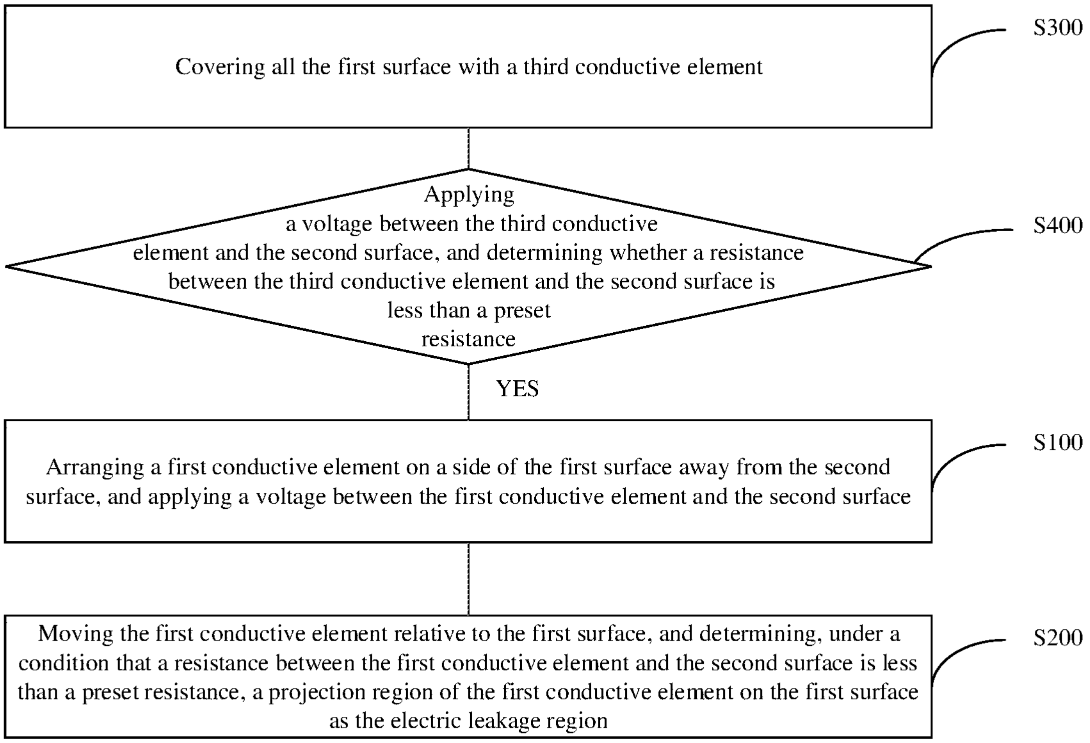
FIG. 8 is a schematic flowchart of an electric leakage detection method according to yet some other embodiments of the present application.

In some optional implementations, as shown in FIG. 8, before step S100, the electric leakage detection method may further include:

S300, covering all the first surface with a third conductive element; and

S400, applying a voltage between the third conductive element and the second surface, and performing, under a condition that a resistance between the third conductive element and the second surface is less than a preset resistance, step S100.

In order to improve the efficiency of detection, before determining the specific position of the electric leakage region, it may be determined in advance whether the component to be tested leaks electricity.

The third conductive element may be a conductive foam, a conductive silica gel, or the like, and covers all the first surface. Under a condition that it is detected that the resistance is less than the preset resistance, it may be determined that the component to be tested leaks electricity, and then step S100 is performed. Under a condition that it is detected that the resistance is greater than or equal to the preset resistance, it may be determined that the component to be tested does not leak, and step S100 does not need to be performed.

It may be understood that, the first surface may include one surface, and, of course, the first surface may include a plurality of surfaces. In an example, the first surface is a surface of the insulation layer arranged outside the casing body. Under a condition that the casing body is in the shape of a cylinder, the first surface may be the annular surface and the bottom surface; and under a condition that the casing body is in a shape of a cuboid, the first surface may include four side surfaces and one bottom surface.

Optionally, under a condition that the first surface includes a plurality of surfaces, the third conductive element may be arranged in each of the surfaces, an electric leakage condition of each of the surfaces may be detected to determine a specific electric leakage surface, and then step S100 may be performed, which further improves the efficiency of electric leakage detection.

As shown in FIG. 7 to FIG. 14, based on the same inventive concept, the embodiments of the present application further provides an electric leakage detection apparatus.

Figure 9:
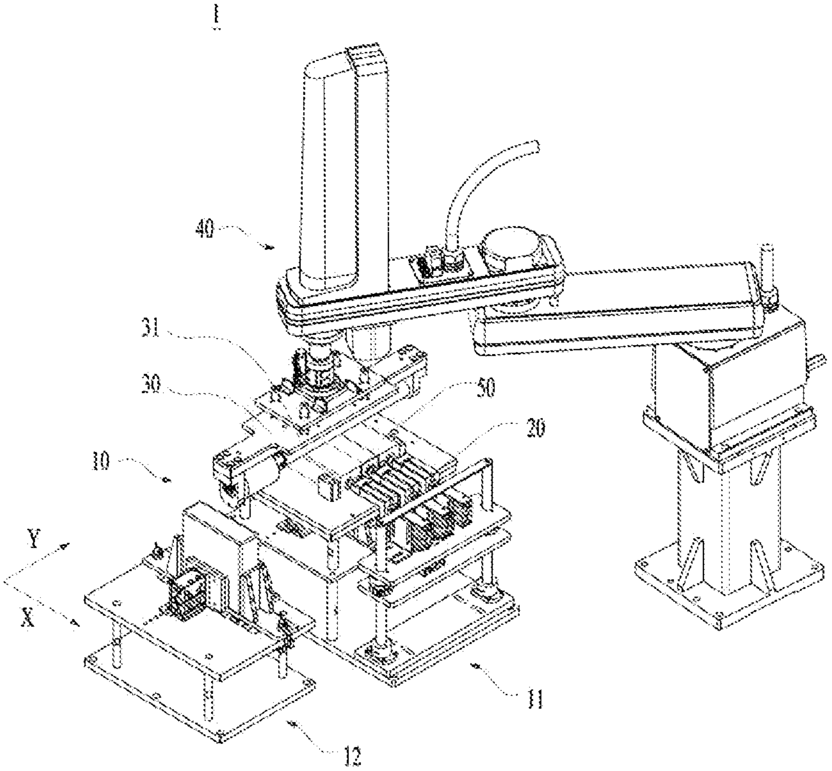
FIG. 9 is a schematic structural view of an electric leakage detection apparatus according to some embodiments of the present application.
Figure 10:
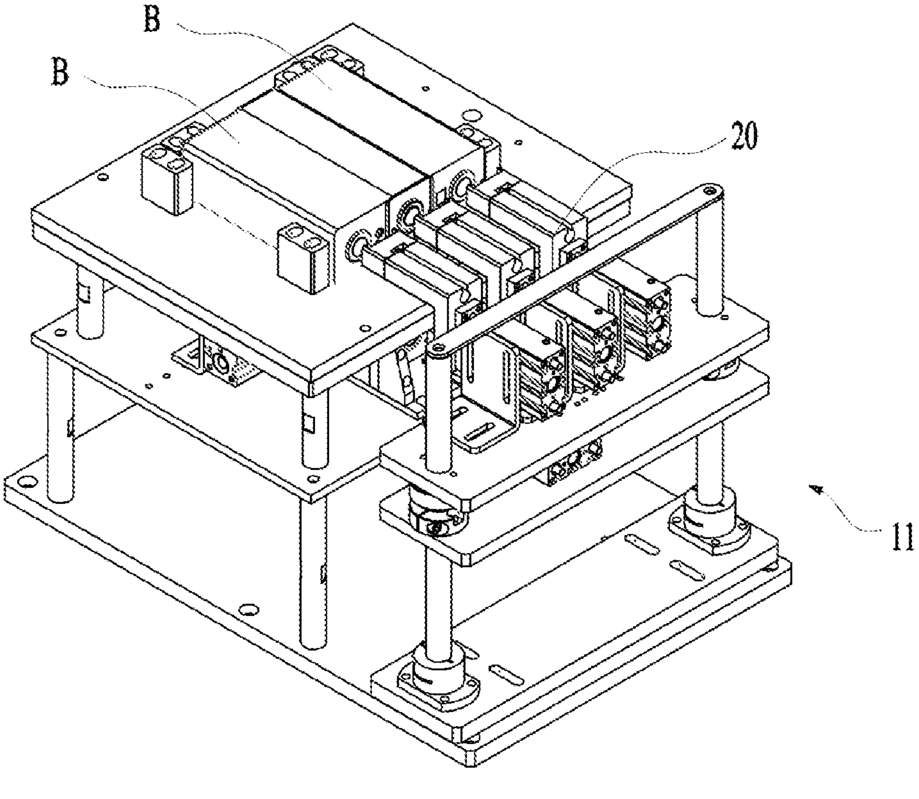
FIG. 10 is a first schematic local structural view of an electric leakage detection apparatus according to some embodiments of the present application.

As shown in FIG. 9 and FIG. 10, the electric leakage detection apparatus 1 is used configured to detect an electric leakage region of a component 50 to be tested, the component 50 to be tested includes a first surface and a second surface, the first surface is arranged in at least a part of the second surface, and the electric leakage detection apparatus 1 includes a base 10, a voltage supply device 20, a detection device 30, and a power source 40. The base 10 is configured to hold the component 50 to be tested; the voltage supply device 20 is arranged on the base 10, and one terminal of the voltage supply device 20 is electrically connected to the second surface; the detection device 30 is electrically connected to the other terminal of the voltage supply device 20, and the detection device 30 is arranged on a side of the first surface away from the second surface; and the power source 40 is connected to the component 50 to be tested and/or the detection device 30 to drive the component to-be-detected and the detection device 30 to move relatively, so as to determine the electric leakage region under a condition that a resistance between the detection device 30 and the second surface is less than a preset resistance.

Figure 11:
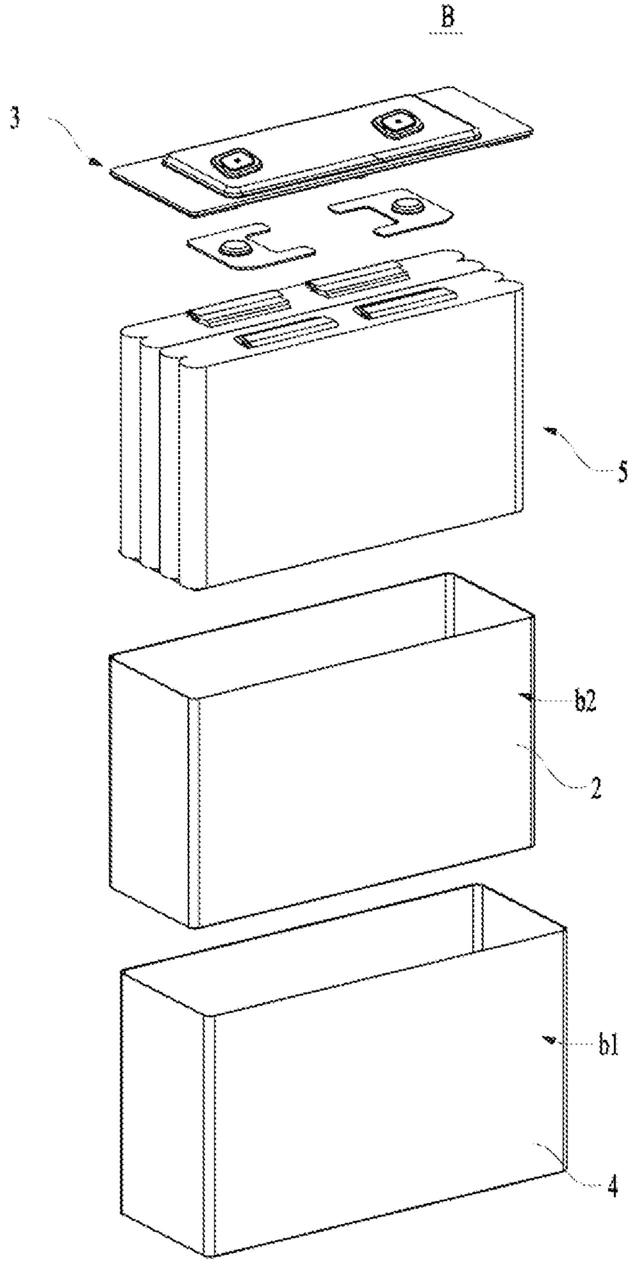
FIG. 11 is an exploded schematic view of a battery cell according to some embodiments of the present application.

FIG. 11 shows a specific example of the component 50 to be tested, and as shown in FIG. 11, the component 50 to be tested may be a battery cell B, a second surface b2 of a housing assembly of the battery cell B is the second surface, and the second surface b2 is an external surface of the housing assembly. That is, the second surface includes an external surface of a casing body 2 and an external surface of an end cap 3; a first surface b1 of an insulation layer 4 arranged on a surface of the casing body 2 away from an electrode assembly 5 is the first surface, and the first surface b1 is an external surface of the insulation layer 4. Under a condition that a voltage is applied to the second surface b2, one terminal (such as the positive electrode) of the voltage supply device 20 may be connected to the external surface of the casing body 2 or the external surface of the end cap 3.

It may be understood that, the component to be tested may further be a motor device or the like. For the convenience of description, a battery cell is used as the component 50 to be tested in the following description.

The base 10 may fix the component 50 to be tested. In an example, the base 10 may include an accommodating cavity for accommodating the component 50 to be tested. Alternatively, the base 10 may include a fixation component for fixing the component 50 to be tested. Of course, the base 10 may also be connected to the component 50 to be tested in a movable manner.

With further reference to FIG. 9 to FIG. 11, optionally, the base 10 may include a first portion 11 and a second portion 12, the first portion 11 has an overall height higher than that of the second portion 12. The base 10 may be used for carrying a plurality of components 50 to be tested, different components 50 to be tested may be arranged on the first portion 11 or the second portion 12, and the positions where the components 50 to be tested are arranged may be selected according to specific surfaces to be tested of the components 50 to be tested. Of course, the electric leakage detection may be performed on the different components 50 to be tested on the first portion 11 and the second portion 12 at the same time. In an example, under a condition that a side surface of the casing body 2 of the battery cell B is detected, the battery cell B may be arranged on the first portion 11; under a condition that a bottom surface of the casing body 2 of the battery cell B is detected, the battery cell B may be arranged on the second portion 12. Since the overall height of the first portion 11 is higher than that of the second portion 12, and a size of the battery cell B along the height direction is greater than sizes of the battery cell B along the width direction and the length direction, a height of a bottom surface of the battery cell B located on the second portion 12 may be substantially the same as a height of a side surface of the battery cell B located on the first portion 11, so that the electric leakage detection may be performed using the same detection device, and a height of the detection device hardly needs to be adjusted, thereby improving the efficiency of detection.

The voltage supply device 20 can provide a voltage, and in an example, the voltage supply device 20 may be an insulation and withstanding voltage tester. Since the insulation layer 4 is arranged outside the casing body of the battery cell B, the casing body is covered by the insulation layer 4 and it is not convenient for the casing body to be connected to the insulation and withstanding voltage tester. Under this condition, one probe of the insulation and withstanding voltage tester may be electrically connected to the component 50 to be tested such as the end cap 3 of the battery cell B, and the other probe of the insulation and withstanding voltage tester may be electrically connected to the detection device 30, and whether there is electric leakage may be determined by detecting a resistance between the end cap 3 and the detection device 30.

The power source 40 may provide power for the component 50 to be tested to cause the component 50 to be tested to move, and under this condition, the detection device 30 may be relatively fixed. Of course, the power source 40 may also provide power for the detection device 30 to cause the detection device 30 to move, and under this condition, the component 50 to be tested may be relatively fixed. Alternatively, the power source 40 may provide force along opposite directions for the detection device 30 and the component 50 to be tested so that the detection device 30 and the component 50 to be tested move relative to each other.

In the electric leakage detection apparatus 1 according to the embodiments of the present application, the power source 40 can move the detection device 30 relative to the first surface, and under a condition that the detection device 30 is located in the electric leakage region, the detected resistance is less than the preset resistance, the position of the electric leakage region is thus determined, and the accuracy of electric leakage detection can be significantly improved.

With further reference to FIG. 9 to FIG. 11, in some optional implementations, the detection device 30 includes a first conductive element 31. The first conductive element 31 is electrically connected to the voltage supply device 20 and arranged on a side of the first surface away from the second surface, and the power source 40 is configured to drive the component 50 to be tested and/or the first conductive element 31 to move relatively along a first direction X and a second direction Y, respectively, so as to obtain, under a condition that a resistance between the first conductive element 31 and the second surface is less than a preset resistance, a coordinate set and an electric leakage region, and the first direction X intersects the second direction Y.

In an example, the first conductive element 31 may be an electric roller. Under a condition that the electric roller passes through the electric leakage region, the voltage can break through the electric leakage region, so that two terminals of the voltage supply device 20 are conducting. The electric roller can roll along the first surface, and the electric roller has a relatively small contact area with the first surface, so that the accuracy of detecting the electric leakage region may be improved. Of course, the first conductive element 31 may also be a plate-like structure. The plate-like structure is relatively flexible and may be provided according to the structure of the first surface. The coordinate set corresponding to the detected resistance less than the preset resistance can be determined based on moving the first conductive element 31 relative to the first surface along the first direction X and the second direction Y each, so as to obtain the electric leakage region, thereby further improving the accuracy of electric leakage detection.

In an example, the component to be tested is the battery cell B, the positive electrode of the voltage supply device 20 is connected to the end cap 3 of the battery cell B, the negative electrode is connected to the first conductive element 31, and the first conductive element 31 is moved along the first direction X and the second direction Y each, so as to detect and determine the electric leakage region.

Optionally, an outline shape of the first conductive element 31 matches a shape of the first surface, and the first conductive element 31 can be in close contact with the first surface to facilitate the first conductive element 31 moving relative to the first surface.

In an example, the first surface is an annular surface, and an outline of the first conductive element 31 may be provided as an annular plate-like structure to match the first surface. Alternatively, the first surface is a plane, and the outline of the first conductive element 31 is provided as a planar plate-like structure.

Figure 12:
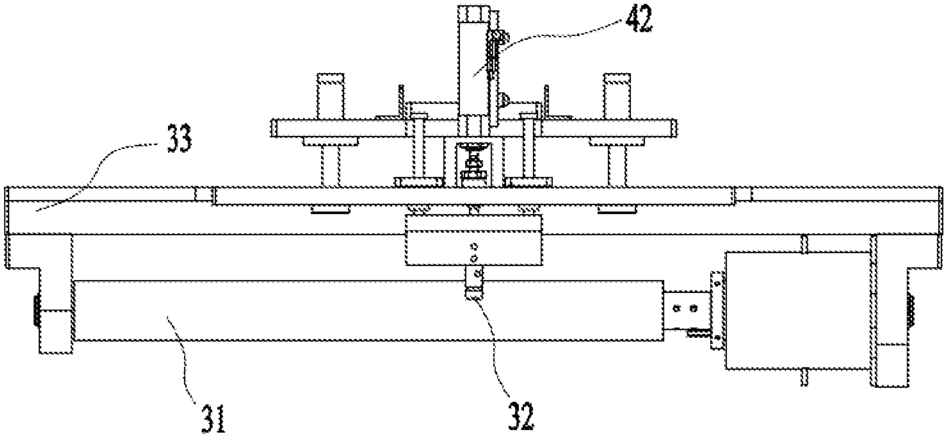
FIG. 12 is a second schematic local structural view of an electric leakage detection apparatus according to some embodiments of the present application.
Figure 13:
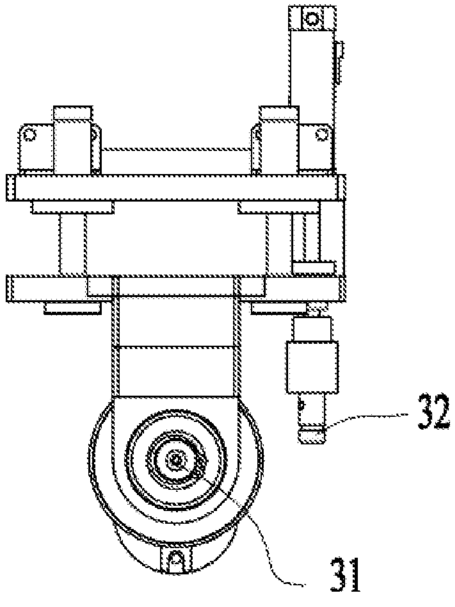
FIG. 13 is a schematic structural view of the electric leakage detection apparatus shown in FIG. 12 from another perspective.

As shown in FIG. 12 and FIG. 13, in some optional implementations, the detection device 30 further includes a second conductive element 32. The second conductive element 32 is electrically connected to the voltage supply device, and the second conductive element 32 is arranged on the first surface at a position corresponding to the coordinate set and is configured to determine, under a condition that a resistance between the second conductive element 32 and the second surface is less than a preset resistance, a projection region of the second conductive element 32 on the first surface as the electric leakage region.

In the embodiments of the present application, detection is performed on the position in the first surface corresponding to the coordinate set by arranging the second conductive element 32, and thus a non-electric-leakage region may be excluded, thereby further improving the accuracy of electric leakage detection. In an example, the second conductive element 32 is a conductive pillar. A cross sectional area of the conductive pillar is relatively small, and under a condition that the electric leakage detection is performed, the conductive pillar is hardly interfered by other positions, thereby improving the accuracy of detection.

The second conductive element 32 may be connected to a second drive mechanism, and the second drive mechanism drives the second conductive element 32 to move towards the first surface, so that the second conductive element is in contact with the first surface, thereby achieving the electric leakage detection; after the detection, the second drive mechanism may drive the second conductive element 32 to move away from the second surface.

Optionally, a plurality of second conductive elements 32 may be provided, and may be arranged in respective positions corresponding to the coordinate set on the first surface, thereby improving the efficiency of detection. Of course, alternatively, one second conductive element 32 may be provided, and may be arranged in each of the positions in sequence, thereby excluding the interference positions.

In an example, the component to be tested is the battery cell, the positive electrode of the voltage supply device is connected to the end cap of the battery cell, the negative electrode is connected to the second conductive element 32, and the second conductive element 32 is arranged in each of the positions in the coordinate set, so as to detect and determine the electric leakage region, and exclude the interference positions.

Figure 14:
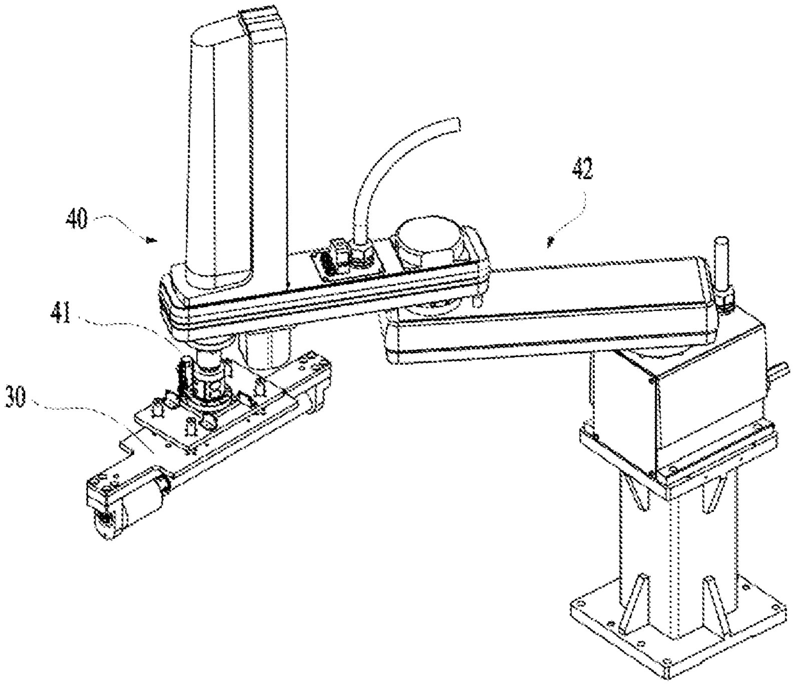
FIG. 14 is a third schematic local structural view of an electric leakage detection apparatus according to some embodiments of the present application.

With reference to FIG. 12 to FIG. 14, optionally, the detection device 30 further includes a support mechanism 33 connected to the first conductive element 31. The power source 40 includes a first drive mechanism 41 and a second drive mechanism 42. The first drive mechanism 41 is connected to the support mechanism 33, so as to drive the support mechanism 33 to move the first conductive element 31, so that the first conductive element 31 moves relative to the first surface. The second drive mechanism 42 includes a drive component connected to the support mechanism and a drive shaft connected to the drive component, and the drive shaft penetrates through the support mechanism 33 and is connected to the second conductive element 32, so as to drive the second conductive element 32 to move toward or away from the first surface. In an example, the first drive mechanism 41 may be an electric cylinder, an air cylinder, or the like, and the second drive mechanism 42 may be an electric cylinder, an air cylinder, or the like.

The first drive mechanism 41 drives the first conductive element 31 to move, and the second drive mechanism 42 drives the second conductive element 32 to move, so that distances the first conductive element 31 and the second conductive element 32 move can be controlled precisely, thereby improving the accuracy of detection. In addition, in the embodiments of the present application, the detection device 30 and the power source 40 may be integrated into an integrated structure to facilitate assembly.

In some optional implementations, the detection device 30 further includes a picture acquisition element. The picture acquisition element is configured to acquire picture information containing positions in the first surface corresponding to the coordinate set, and determine, under a condition that the picture information contains defect information, a position corresponding to the defect information as the electric leakage region.

In an example, the picture acquisition element may be a charge coupled device (CCD) camera or, of course, a scanning device.

In the embodiments of the present application, picture information analysis is performed on the position in the first surface corresponding to the coordinate set by the picture acquisition element, and thus a non-electric-leakage region may be excluded, thereby further improving the accuracy of electric leakage detection.

Figure 15:
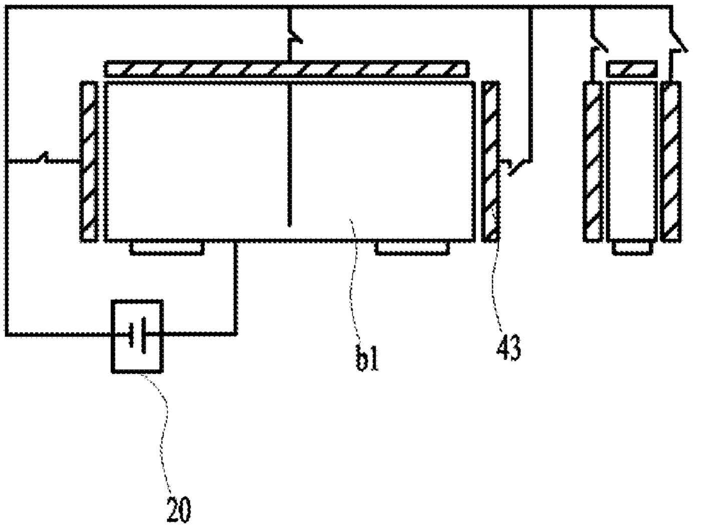
FIG. 15 is a schematic application view an electric leakage detection apparatus according to some embodiments of the present application.

In some optional implementations, as shown in FIG. 15, the detection device 30 further includes a third conductive element 43. The third conductive element 43 is electrically connected to the voltage supply device 20, the third conductive element 43 covers all the first surface and is configured to determine, under a condition that a resistance between the third conductive element 43 and the second surface is less than a preset resistance, the first surface leaks electricity.

In the embodiments of the present application, an electric leakage predetermination may be performed on the component to be tested in advance by providing the third conductive element 43, and under a condition that an electric leakage condition of the first surface is determined, the specific electric leakage region of the first surface is detected by using the first conductive element, thereby improving the efficiency of the electric leakage detection. In the embodiments of the present application, the third conductive element 43 may be a conductive foam.

It may be understood that, the first surface may include a plurality of surfaces; accordingly, a plurality of third conductive elements 43 may be provided. In an example, the first surface includes a third surface and a fourth surface, and two third conductive elements 43 are provided.

One of the two third conductive elements 43 is arranged on the third surface, a voltage is applied between the third conductive element 43 and the second surface, under a condition that the detected resistance is less than the preset resistance, the third surface leaks electricity, and then an electric leakage region of the third surface is detected by using the first conductive element; and under a condition that the detected resistance is greater than or equal to the preset resistance, the third surface does not leak, and subsequent steps do not need to be performed.

The other of the two third conductive elements 43 is arranged on the fourth surface, and a voltage is applied between the third conductive element 43 and the second surface, under a condition that the detected resistance is less than the preset resistance, the fourth surface leaks electricity, and then an electric leakage region of the fourth surface is detected by using the first conductive element; and under a condition that the detected resistance is greater than or equal to the preset resistance, the fourth surface does not leak, and subsequent steps do not need to be performed.

In an example, the component to be tested is the battery cell, the conductive foam is arranged on an external surface (that is, the first surface b1) of an insulation layer of the casing body. The positive electrode of the voltage supply device 20 is connected to the end cap, and the negative electrode is connected to the third conductive element 43, thereby determining whether the component to be tested leaks electricity.

The following is the specific detection process of the electric leakage detection apparatus according to the embodiments of the present application.

The component to be tested is the battery cell, and the casing body of the battery cell is a cuboid structure. The casing body has four side surfaces and one bottom surface, and a first surface b1 of the insulation layer corresponds to the four side surfaces and the one bottom surface of the casing body, that is, the first surface b1 includes five surfaces.

With further reference to FIG. 15, the five surfaces of the first surface (that is, the five surfaces of the insulation layer) are provided with respective conductive foams, and the conductive foams corresponding to the five surfaces are connected to the negative electrode of the voltage supply device 20, and electric leakage conditions of the five surfaces are detected, so as to determine the surface where the electric leakage region is located.

Figure 16:
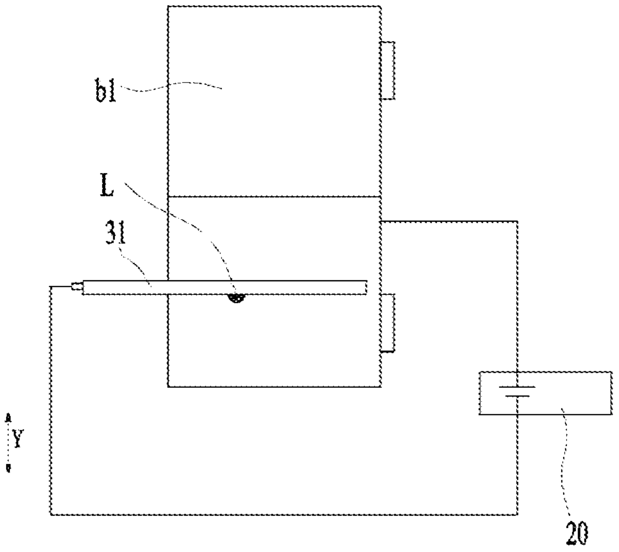
FIG. 16 is a schematic application view an electric leakage detection apparatus according to some other embodiments of the present application.
Figure 17:
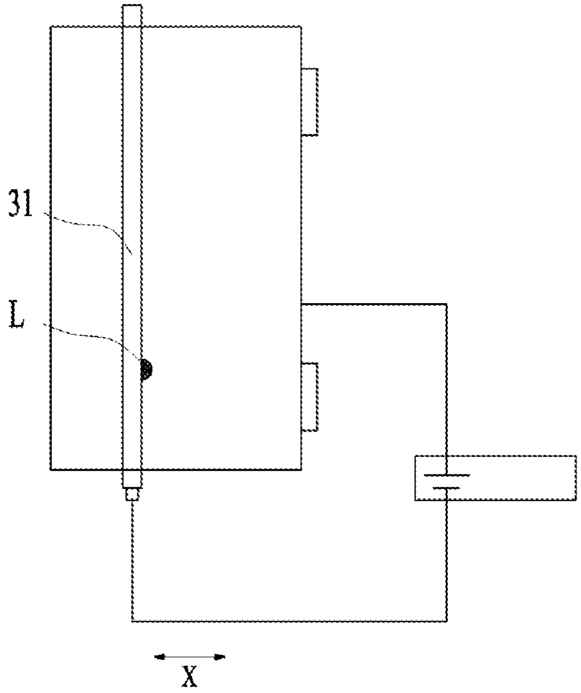
FIG. 17 is a schematic application view the electric leakage detection apparatus shown in FIG. 16 from another perspective.

As shown in FIG. 16 and FIG. 17, after the specific electric leakage surface is determined, detection is performed on an electric leakage region L by using the first conductive element 31.

The first conductive element 31 is moved along the first direction X and the second direction Y each, and coordinates corresponding to detected resistances less than the preset resistance detected by the first conductive element 31 are determined as the coordinate set by permutation and combination.

Figure 18:
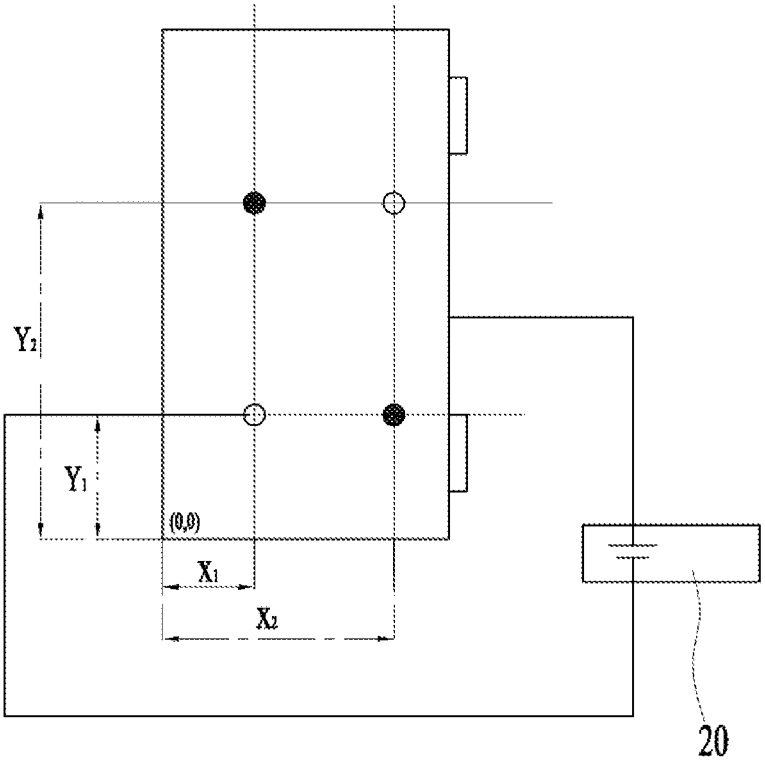
FIG. 18 is a schematic application view an electric leakage detection apparatus according to yet some other embodiments of the present application.
Figure 19:
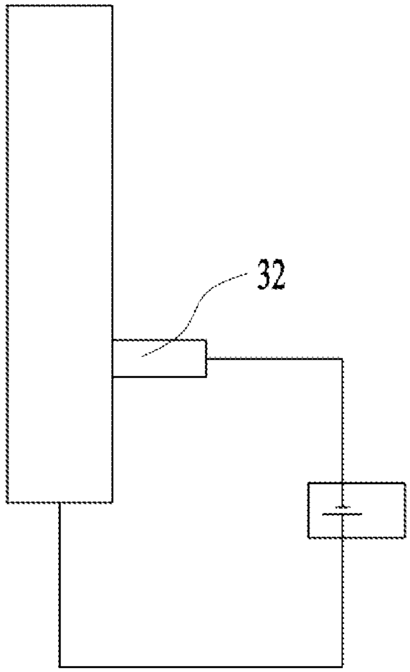
FIG. 19 is a schematic application view the electric leakage detection apparatus shown in FIG. 18 from another perspective.

As shown in FIG. 18 and FIG. 19, each of the coordinates in the coordinate set is tested by using the second conductive element 32. In an example, the coordinate set determined by the first conductive element 31 includes $(X_1, Y_1)$, $(X_1, Y_2)$, $(X_2, Y_1)$, $(X_2, Y_2)$, the detection is performed on the above four coordinates, and $(X_1, Y_1)$ and $(X_2, Y_2)$ are excluded. Thus, the coordinates $(X_1, Y_2)$ and $(X_2, Y_1)$ of the electric leakage region L are accurately determined.

Although the present application has been described with reference to some embodiments, various modifications may be made thereto and components thereof may be replaced with their equivalents without departing from the scope of the present application. In particular, various technical features described in various embodiments can be combined in any manner as long as there is no structural conflict. The present application is not limited to the specific embodiments described herein, and includes all technical solutions that fall within the scope of the claims.

What is claimed is:

1. An electric leakage detection method for detecting an electric leakage region of a component to be tested including a first surface and a second surface, the first surface being provided over at least part of the second surface, the electric leakage detection method comprising:

arranging a first conductive element on a side of the first surface away from the second surface, and applying a first voltage between the first conductive element and the second surface; and moving the first conductive element relative to the first surface, and determining, under a condition that a resistance between the first conductive element and the second surface is less than a first preset resistance, a projection region of the first conductive element on the first surface as the electric leakage region, comprising:

obtaining a coordinate set based on distances of the first conductive element respectively moving along two directions under the condition that the resistance between the first conductive element and the second surface is less than the first preset resistance; and in response determining that a number of positions in the first surface corresponding to the coordinate set is more than one, arranging a second conductive element in each of the positions, applying a second voltage between the second conductive element and the second surface, and determining, under a condition that a resistance between the second conductive element and the second surface is less than a second preset resistance, a projection region of the second conductive element on the first surface as the electric leakage region.

2. The electric leakage detection method according to claim 1, wherein obtaining a coordinate set based on the distances of the first conductive element respectively moving along two directions under the condition that the resistance between the first conductive element and the second surface is less than the first preset resistance comprises:

moving the first conductive element relative to the first surface along a first direction, and determining, under the condition that the resistance between the first conductive element and the second surface is less than the first preset resistance, the distance the first conductive element moves along the first direction as a first coordinate value;

moving the first conductive element relative to the first surface along a second direction, and determining, under the condition that the resistance between the first conductive element and the second surface is less than the first preset resistance, the distance the first conductive element moves along the second direction as a second coordinate value, wherein the first direction intersects the second direction; and obtaining the coordinate set obtained by permutation and combination of the first coordinate value and the second coordinate value.

3. The electric leakage detection method according to claim 1, wherein moving the first conductive element relative to the first surface, and determining, under the condition that the resistance between the first conductive element and the second surface is less than the first preset resistance, the projection region of the first conductive element on the first surface as the electric leakage region further comprises:

determining whether the number of the positions in the first surface corresponding to the coordinate set is one; and determining, under a condition that the number of the positions is one, the position in the first surface corresponding to the coordinate set as the electric leakage region.

4. The electric leakage detection method according to claim 1, further comprising:

in response determining that the number of the positions in the first surface corresponding to the coordinate set is more than one, detecting electric leakage information of the positions each to determine the electric leakage region, comprising:

acquiring picture information of each of the positions; and determining, under a condition that the picture information contains defect information, a position corresponding to the defect information as the electric leakage region.

5. The electric leakage detection method according to claim 1, further comprising:

covering all the first surface with a third conductive element;

applying a third voltage between the third conductive element and the second surface; and under a condition that a resistance between the third conductive element and the second surface is less than a third preset resistance, arranging the first conductive element on the side of the first surface away from the second surface, and applying the first voltage between the first conductive element and the second surface.

6. An electric leakage detection apparatus for detecting an electric leakage region of a component to be tested including a first surface and a second surface, the first surface being provided over at least part of the second surface, the electric leakage detection apparatus comprising:

a base configured to hold the component to be tested;

a voltage supply device arranged on the base, wherein one terminal of the voltage supply device is electrically connected to the second surface;

a detection device electrically connected to the other terminal of the voltage supply device, wherein the detection device is arranged on a side of the first surface away from the second surface; and a power source connected to the component to be tested and/or the detection device to drive the component to be tested and the detection device to move relatively, so as to determine the electric leakage region under a condition that a resistance between the detection device and the second surface is less than a first preset resistance;

wherein:

the detection device comprises a first conductive element electrically connected to the voltage supply device, and a second conductive element electrically connected to the voltage supply device, the first conductive element is arranged on the side of the first surface away from the second surface;

the power source is configured to obtain a coordinate set based on distances of the first conductive element respectively moving along two directions under the condition that the resistance between the first conductive element and the second surface is less than the first preset resistance;

the second conductive element is arranged on the first surface at a position corresponding to the coordinate set and is configured to determine, under a condition that a resistance between the second conductive element and the second surface is less than a second preset resistance, a projection region of the second conductive element on the first surface as the electric leakage region.

7. The electric leakage detection apparatus according to claim 6, wherein the power source is further configured to drive the component to be tested and/or the first conductive element to move relatively along a first direction and a second direction respectively, so as to obtain, under the condition that the resistance between the first conductive element and the second surface is less than the first preset resistance, the coordinate set, wherein the first direction intersects the second direction.

8. The electric leakage detection apparatus according to claim 7, wherein an outline shape of the first conductive element matches a shape of the first surface.

9. The electric leakage detection apparatus according to claim 6, wherein:

the detection device comprises a support mechanism connected to the first conductive element; and the power source comprises:

a first drive mechanism connected to the support mechanism, so as to drive the support mechanism to move the first conductive element, so that the first conductive element moves relative to the first surface; and a second drive mechanism comprising a drive component connected to the support mechanism and a drive shaft connected to the drive component, wherein the drive shaft penetrates through the support mechanism and is connected to the second conductive element, so as to drive the second conductive element to move toward or away from the first surface.

10. The electric leakage detection apparatus according to claim 6, wherein the detection device further comprises a picture acquisition element configured to acquire picture information containing positions in the first surface corresponding to the coordinate set, and determine, under a condition that the picture information contains defect information, a position corresponding to the defect information as the electric leakage region.

11. The electric leakage detection apparatus according to claim 6, wherein the detection device further comprises a third conductive element electrically connected to the voltage supply device, wherein the third conductive element covers all the first surface and is configured to determine, under a condition that a resistance between the third conductive element and the second surface is less than a third preset resistance, an electric leakage condition of the first surface.

12. An electric leakage detection method for detecting an electric leakage region of a component to be tested including a first surface and a second surface, the first surface being provided over at least part of the second surface, the electric leakage detection method comprising:

covering all the first surface with a first conductive element;

applying a first voltage between the first conductive element and the second surface; and under a condition that a resistance between the first conductive element and the second surface is less than a first preset resistance:

arranging a second conductive element on a side of the first surface away from the second surface, and applying a second voltage between the second conductive element and the second surface; and moving the second conductive element relative to the first surface, and determining, under a condition that a resistance between the second conductive element and the second surface is less than a second preset resistance, a projection region of the second conductive element on the first surface as the electric leakage region.

* * * * *